United States Patent
Tanno

(10) Patent No.: US 7,845,547 B2
(45) Date of Patent: Dec. 7, 2010

(54) METHOD FOR MANUFACTURING A PRINTED WIRING BOARD

(75) Inventor: Katsuhiko Tanno, Ibi-gun (JP)

(73) Assignee: IBIDEN Co., Ltd., Ogaki-shi (JP)

(*) Notice: Subject to any disclaimer, the term of this patent is extended or adjusted under 35 U.S.C. 154(b) by 212 days.

(21) Appl. No.: 12/120,046

(22) Filed: May 13, 2008

(65) Prior Publication Data

US 2008/0283580 A1 Nov. 20, 2008

Related U.S. Application Data

(63) Continuation of application No. PCT/JP2006/325407, filed on Dec. 20, 2006.

(30) Foreign Application Priority Data

Dec. 20, 2005 (JP) .............................. 2005-366485

(51) Int. Cl.
*B23K 31/02* (2006.01)

(52) U.S. Cl. .................... 228/215; 228/223; 228/248.1; 228/246

(58) Field of Classification Search .................. None
See application file for complete search history.

(56) References Cited

U.S. PATENT DOCUMENTS

| | | | | |
|---|---|---|---|---|
| 5,641,113 | A * | 6/1997 | Somaki et al. | 228/180.22 |
| 6,189,771 | B1 * | 2/2001 | Maeda et al. | 228/248.1 |
| 6,191,022 | B1 * | 2/2001 | Creswick | 438/612 |
| 6,660,944 | B1 * | 12/2003 | Murata et al. | 174/261 |
| 7,472,473 | B2 * | 1/2009 | Kawamura et al. | 29/747 |
| 7,475,803 | B2 * | 1/2009 | Sumita et al. | 228/246 |
| 7,654,432 | B2 * | 2/2010 | MacKay et al. | 228/39 |
| 2003/0157761 | A1 * | 8/2003 | Sakuyama | 438/200 |
| 2006/0157540 | A1 * | 7/2006 | Sumita et al. | 228/180.22 |

(Continued)

FOREIGN PATENT DOCUMENTS

JP        7-201870        8/1995

(Continued)

OTHER PUBLICATIONS

U.S. Appl. No. 12/120,076, filed May 13, 2008, Tanno et al.

(Continued)

*Primary Examiner*—Kiley Stoner
(74) *Attorney, Agent, or Firm*—Oblon, Spivak, McClelland, Maier & Neustadt, L.L.P.

(57) ABSTRACT

A method for manufacturing a printed wiring board having a bump. The method includes forming a solder-resist layer having a small-diameter aperture and a large-diameter aperture, each aperture exposing a respective conductive pad of the printed wiring board, and printing a solder paste in the large-diameter aperture in the solder-resist layer, but not printing the solder paste in the small-diameter aperture in the solder resist layer. The method also includes loading a solder ball in each of the large-diameter aperture and the small-diameter aperture using a mask having aperture areas that correspond to the small-diameter aperture and large-diameter aperture of the solder-resist layer, and forming a small-diameter bump from the solder ball in the small-diameter aperture and a large-diameter bump from both the solder paste and the solder ball in the large-diameter aperture.

5 Claims, 14 Drawing Sheets

U.S. PATENT DOCUMENTS

2006/0208041 A1* 9/2006 MacKay et al. ............ 228/254
2008/0078810 A1  4/2008 Kawamura et al.
2009/0250813 A1* 10/2009 Lin et al. .................... 257/737

FOREIGN PATENT DOCUMENTS

| JP | 9-57432 | 3/1997 |
|---|---|---|
| JP | 9-107045 | 4/1997 |
| JP | 2001-267731 | 9/2001 |
| JP | 2005-209847 | 8/2005 |
| WO | WO 2006/013742 | 2/2006 |

OTHER PUBLICATIONS

U.S. Appl. No. 12/093,436, filed May 12, 2008, Tanno et al.

* cited by examiner

METHOD FOR MANUFACTURING A PRINTED WIRING BOARD

CROSS REFERENCE TO RELATED APPLICATIONS

This application is a continuation of PCT/JP06/325407, filed Dec. 20, 2006, which claims priority to Japanese patent application No. 2005-366485, filed Dec. 20, 2005, the entire contents of each of which is incorporated herein by reference.

BACKGROUND OF THE INVENTION

1. Field of the Invention

The present invention relates to a method for manufacturing a printed wiring board, and more specifically relates to a method for manufacturing a printed wiring board that is preferably used for a package substrate for mounting an IC chip.

2. Discussion of the Background

A solder bump is used for electrically wiring a package substrate and an IC chip. The solder bump is formed through the following processes:

(1) A process to print flux on a joint pad formed on the package substrate.

(2) A process to mount a solder ball on the joint pad upon which flux is printed.

(3) A process to form a solder bump from the solder ball by reflowing.

After forming the solder bump on the package substrate, the IC chip is placed on the solder bump, the solder bump and the pad (terminal) of the IC chip are joined together by reflowing, and the IC chip is mounted on the package substrate. In the abovementioned processes to mount a solder ball on a joint pad, a print technology is used, for example by concomitantly using a mask for aligning a ball and a squeegee as shown in Japanese Unexamined Patent Application Publication No. 2001-267731

SUMMARY OF THE INVENTION

The present invention broadly comprises a method for manufacturing a printed wiring board having a bump. The method includes forming a solder-resist layer having a small-diameter aperture and a large-diameter aperture, each aperture exposing a respective conductive pad of the printed wiring board, and printing a solder paste in the large-diameter aperture in the solder-resist layer, but not printing the solder paste in the small-diameter aperture in the solder resist layer. The method also includes loading a solder ball in each of the large-diameter aperture and the small-diameter aperture using a mask having aperture areas that correspond to the small-diameter aperture and large-diameter aperture of the solder-resist layer, and forming a small-diameter bump from the solder ball in the small-diameter aperture and a large-diameter bump from both the solder paste and the solder ball in the large-diameter aperture.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1:
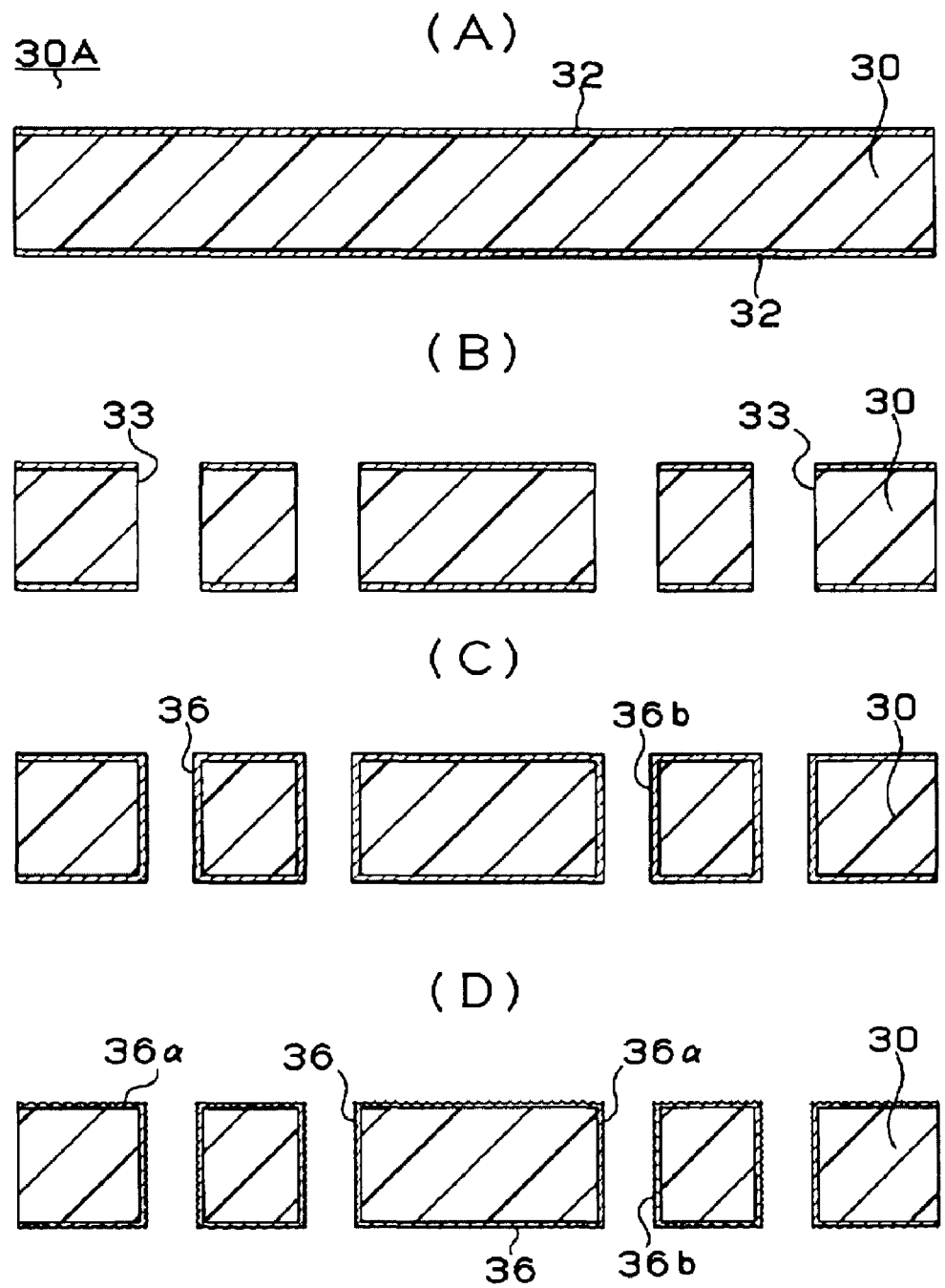
FIG. 1 is a flowchart showing a method for manufacturing a multilayered printed wiring board according to an embodiment of the present invention.

Because a small-diameter solder ball can become smaller than a sand grain, for example, in the method for concomitantly using a mask for aligning a ball and a squeegee as in JP 2001-267731, the solder ball is deformed by the squeegee and the height of the solder bump can vary, resulting in quality and reliability deterioration of the end device. For example, when a solder ball becomes smaller, the ratio of the weight to the surface area decreases and an adsorptive phenomenon occurs to the solder ball due to the intermolecular force. In the prior art, because a solder ball that aggregates easily comes in contact with a squeegee, the solder ball is damaged and partially defected. If the solder ball is partially defected, the volume of the solder bump becomes different on each joint pad and the height of the solder bump varies as mentioned above.

One of the objectives of the present invention is to provide a method for manufacturing a printed wiring board to form bumps of approximately the same height on joint pads with differing aperture diameters of solder masks (a semiconductor circuit in which sizes exposed from a solder-mask layer each differ).

One embodiment of the invention includes a method for manufacturing a printed wiring board with a bump, including at least the following (a) to (d) steps:

(a) a process to form a solder-resist layer having a small-diameter aperture and a large-diameter aperture so as to expose a joint pad;

(b) a process to print a low-melting metal ball in a paste form to a large-diameter aperture in said solder-resist layer;

(c) a process to mount a low-melting metal ball in said large-diameter aperture and small-diameter aperture by using a mask comprising aperture areas that correspond to the abovementioned small-diameter aperture and large-diameter aperture on the solder-resist layer; and (d) a process to form a small-diameter bump from the abovementioned low-melting metal ball of the small-diameter aperture and a large-diameter bump from the low-melting metal in a paste form and the low-melting metal ball of the abovementioned large-diameter aperture by reflowing.

In one embodiment, a low-melting metal in a paste form is printed on a large-diameter aperture of a solder-resist layer. Then, the low-melting metal ball is mounted on the large-diameter aperture and the small-diameter aperture of the solder-resist layer by using a mask. Because a small-diameter bump is formed from the low-melting metal ball at the small-diameter aperture of the solder-resist layer and a large-diameter bump is formed from either the low-melting metal in a paste form or the low-melting metal ball at the large-diameter aperture of the solder-resist layer by reflowing, even if the diameters of the solder-resist apertures to expose joint pads differ, the small-diameter bump and the large-diameter bump can be formed at approximately the same height. Consequently, when an IC chip is mounted through the small-diameter bump and large-diameter bump, it is possible to secure joint reliability between the IC chip and a printed wiring board.

In one embodiment, after reflowing the low-melting metal in a paste form in the large-diameter aperture of the solder-resist layer, the low-melting metal balls are mounted on the small-diameter aperture and large-diameter aperture of the solder-resist layer by using a mask. Because the mask is not mispositioned even if the mask comes into contact with the low-melting metal in the large-diameter aperture, the mask can be positioned proximately to the solder-resist layer and the low-melting metal ball can be mounted appropriately on the aperture of the solder-resist layer, resulting in avoiding or reducing a chance of mispositioning or missing a bump.

In another embodiment, because a flux is applied before mounting a low-melting metal ball on the small-diameter aperture and large-diameter aperture of the solder-resist layer by using a mask, the low-melting metal ball can be mounted easily and the once-mounted low-melting metal ball cannot be easily mispositioned.

In still another embodiment, because a flux is applied before printing a low-melting metal in a paste form on the large-diameter aperture of the solder-resist layer, it is not required for applying the flux before mounting the low-melting metal ball. In other words, after printing the low-melting metal in a paste form, low-melting metal balls are mounted on the flux of the small-diameter aperture of the solder-resist layer and on the low-melting metal in a paste form of the large-diameter aperture and said low-melting metal in a paste form and low-melting metal ball can be reflowed at the same time. Reducing the time needed for reflowing can avoid decreases to reliability caused by thermal history.

In yet another embodiment, a cylinder member is positioned on the upper side of the mask, low-melting metal balls are aggregated by intaking air from an aperture area of the cylinder member, the aggregated low-melting metal balls are moved by moving the cylinder member horizontally, and the low-melting metal balls are dropped into the small-diameter aperture and the large-diameter aperture of the solder-resist layer through an aperture area of the mask. Consequently, fine low-melting metal balls can be securely mounted on all, or essentially all, of the apertures of the solder-resist layer. Additionally, because the low-melting metal ball is moved without contacting, unlike cases involving the use of a squeegee, it can be mounted on the small-diameter aperture and the large-diameter aperture without damaging the low-melting metal ball, and the height of the bump can be made more uniform. Furthermore, even on an undulated printed wiring board (i.e. uneven surface) such as a build-up multilayered wiring board, a low-melting metal ball can be placed appropriately through the aperture.

Figure 14:
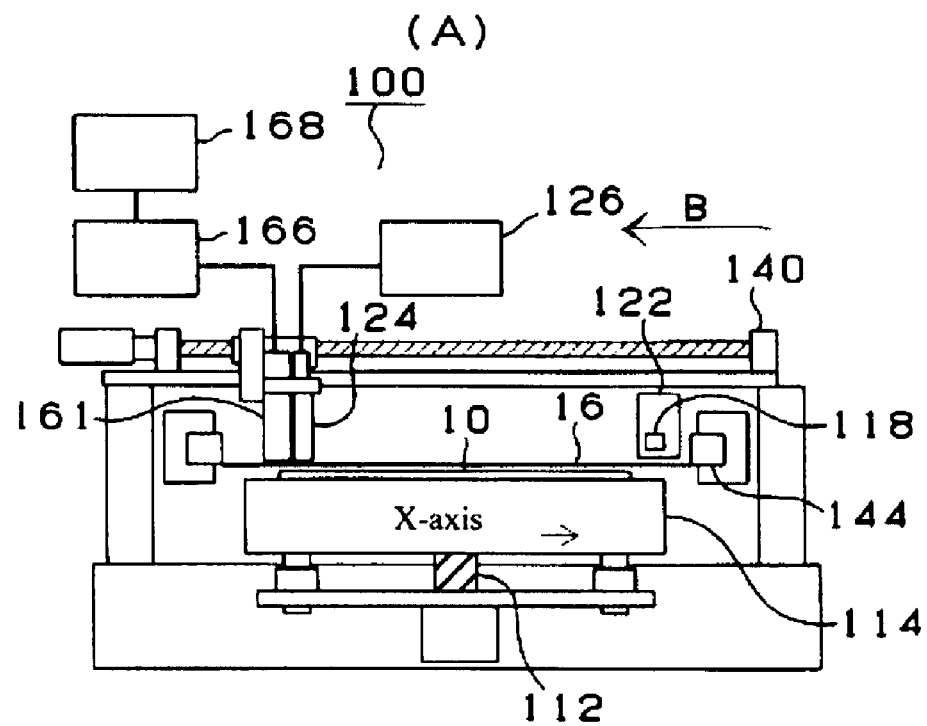
FIG. 14 (A) shows the framework of a device for mounting a solder ball related to the Embodiments of the present invention, and FIG. 14 (B) shows the view from arrow B of the device for mounting a solder ball in FIG. 14 (A) according to an embodiment of the present invention.
Figure 14:
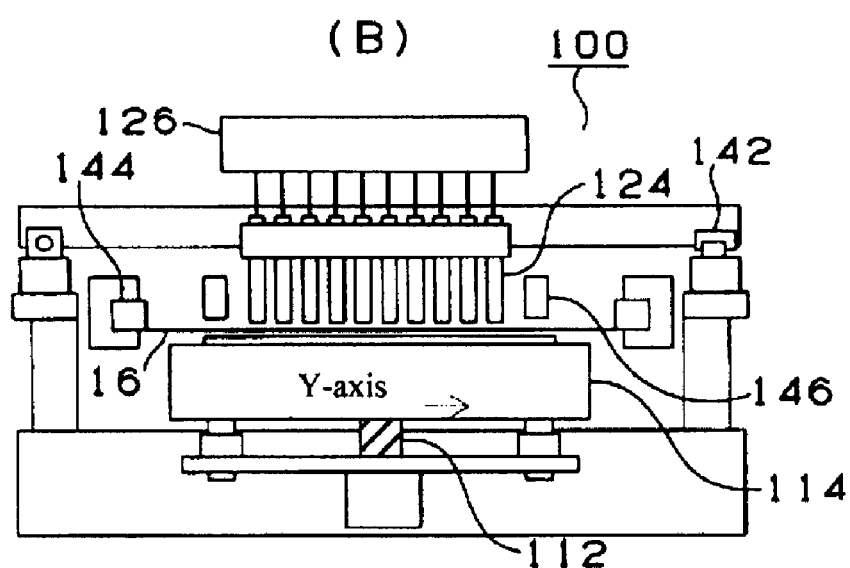

FIG. 14(A) shows the framework of a device for mounting a solder ball related to one example of the embodiments in the present invention, and FIG. 14(B) shows the view from arrow B of the device for mounting a solder ball in FIG. 14 (A). For example, the device of FIGS. 14A and 14B may be used to mount a small solder ball 77 (less than 200 μm in diameter) on a joint pad of the multilayered printed wiring board.

A device for mounting a solder ball 100 comprises: a XYθ suction table 114 that holds the positioning of a multilayered printed wiring board 10, a vertically moving axis 112 that moves said XYθ suction table 114 up and down, and a mask for aligning a ball 16, the mask comprising an aperture that corresponds to a joint pad of the multilayered printed wiring board. Also included is a mount cylinder (cylindrical member) 124 that guides a solder ball moving on the mask for aligning a ball 16, a suction box 126 that provides negative pressure on the mount cylinder 124, a cylinder for removing absorbed balls 161 to collect redundant solder balls, and a suction box 166 that provides negative pressure on said cylinder for removing absorbed balls 161. Also included is a suction device for removing absorbed balls 168 that holds the collected solder balls, a mask clamp 144 that clamps the mask for aligning a ball 16; and a moving axis in the X direction 140 that sends the mount cylinder 124 and the cylinder for removing absorbed balls 161 in an X direction. In one embodiment, the clamp 144 may be fixed to the table 114 such that the mask moves with the table when the table is movable. Further included in the embodiment of FIGS. 14A and 14B is a support guide for the moving axis 142 that supports the moving axis in an X direction 140, an alignment camera 146 that images a multilayered printed wiring board 10, a sensor for detecting remaining quantity 118 that detects the remaining quantity of solder balls under the mount cylinder 124, and a feeding device for solder balls 122 that feeds solder balls to the mount cylinder 124 according to the remaining quantity detected by the sensor for detecting remaining quantity 118.

Figure 8:
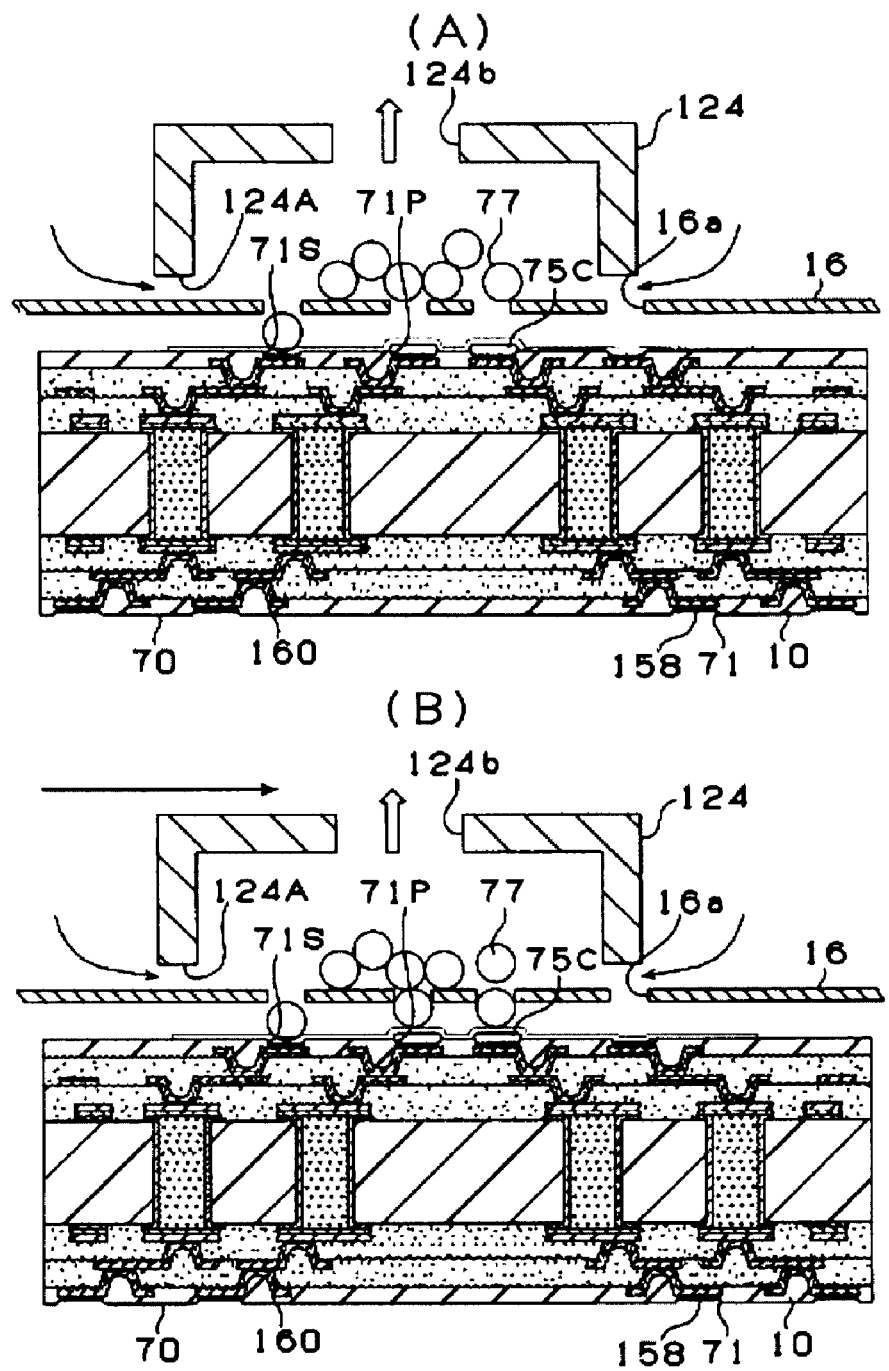
FIG. 8 is a flowchart showing a method for manufacturing a multilayered printed wiring board according to an embodiment of the present invention.
Figure 9:
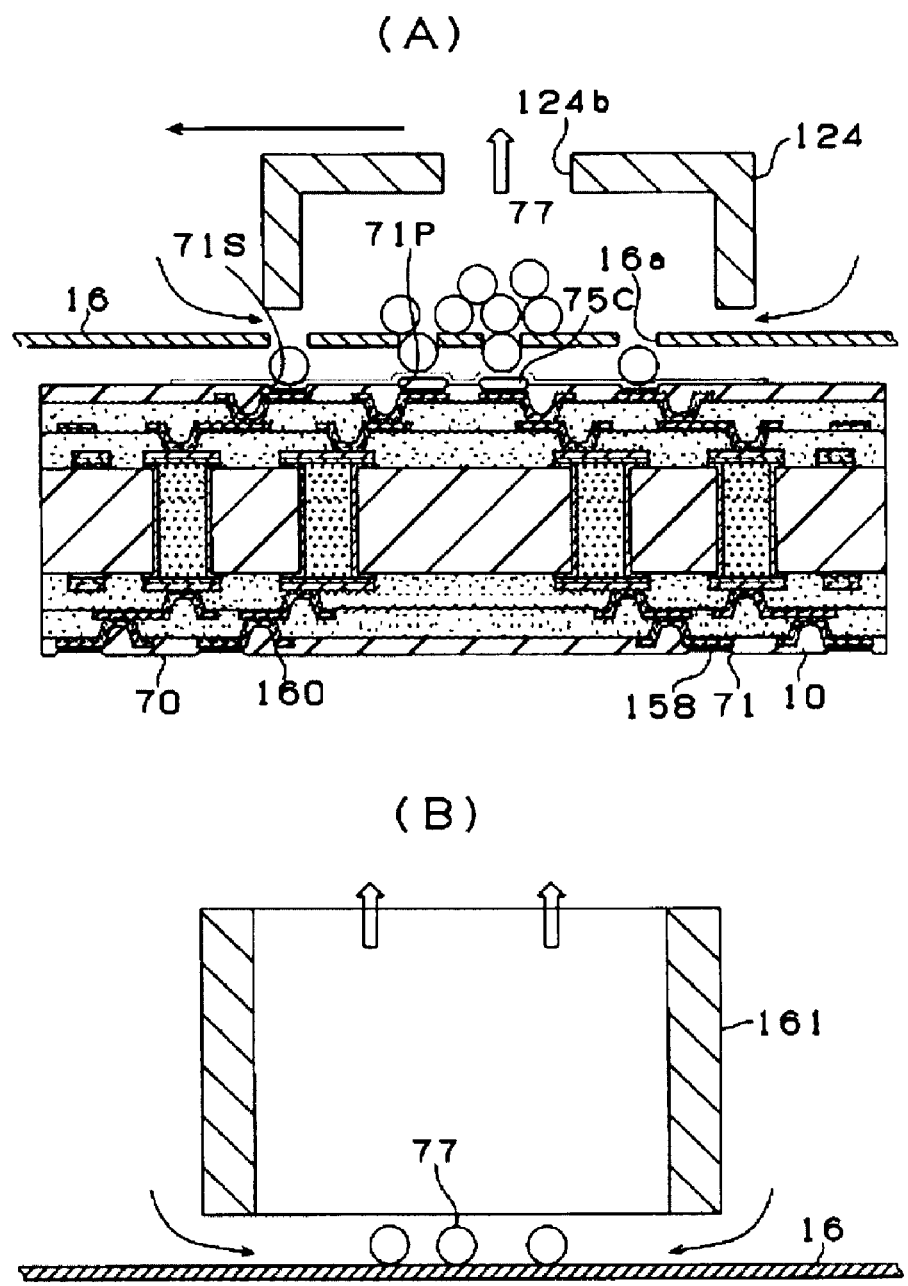
FIG. 9 is a flowchart showing a method for manufacturing a multilayered printed wiring board according to an embodiment of the present invention.
Figure 10:
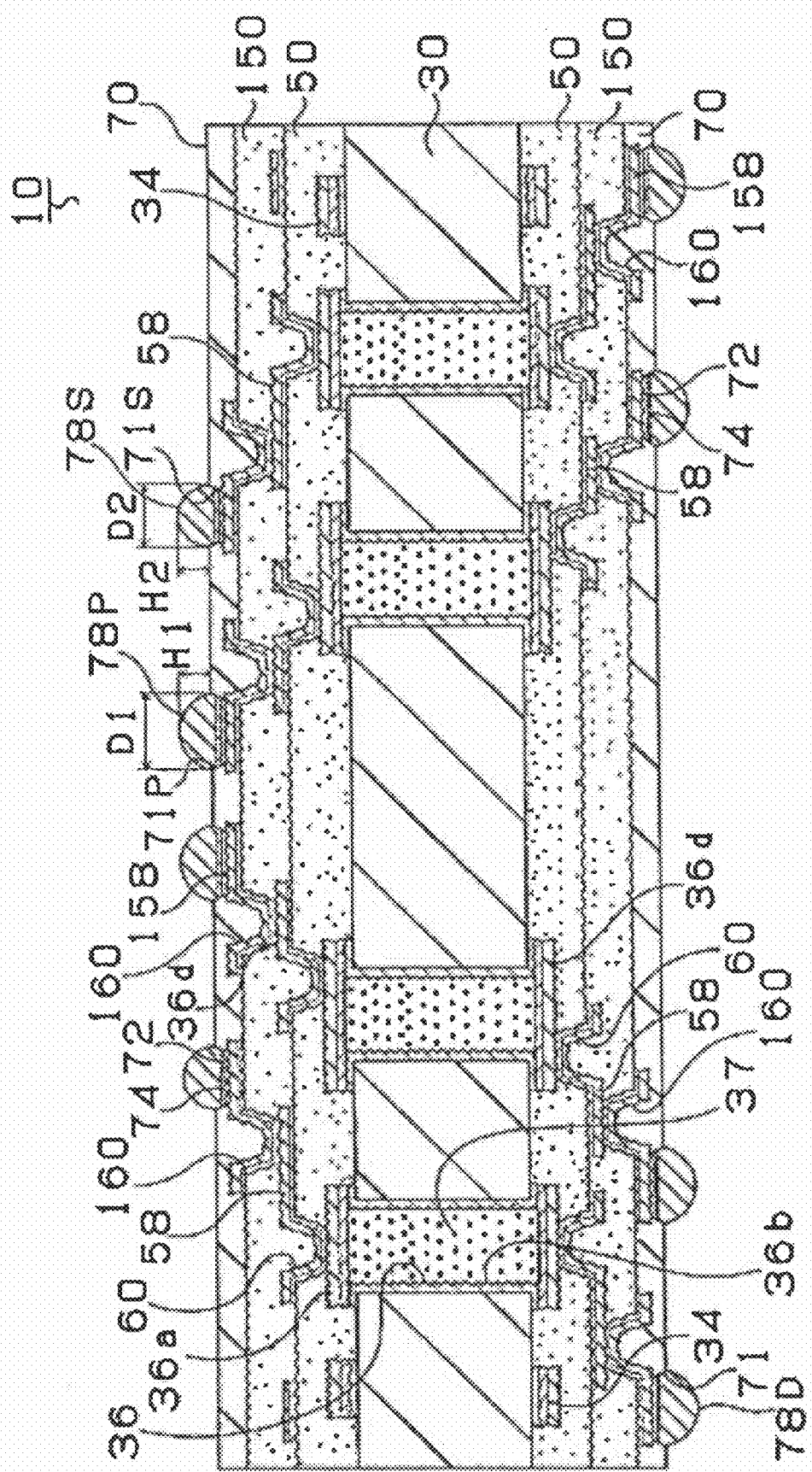
FIG. 10 is a cross-sectional view of a multilayered printed wiring board related to an embodiment of the present invention.
Figure 11:
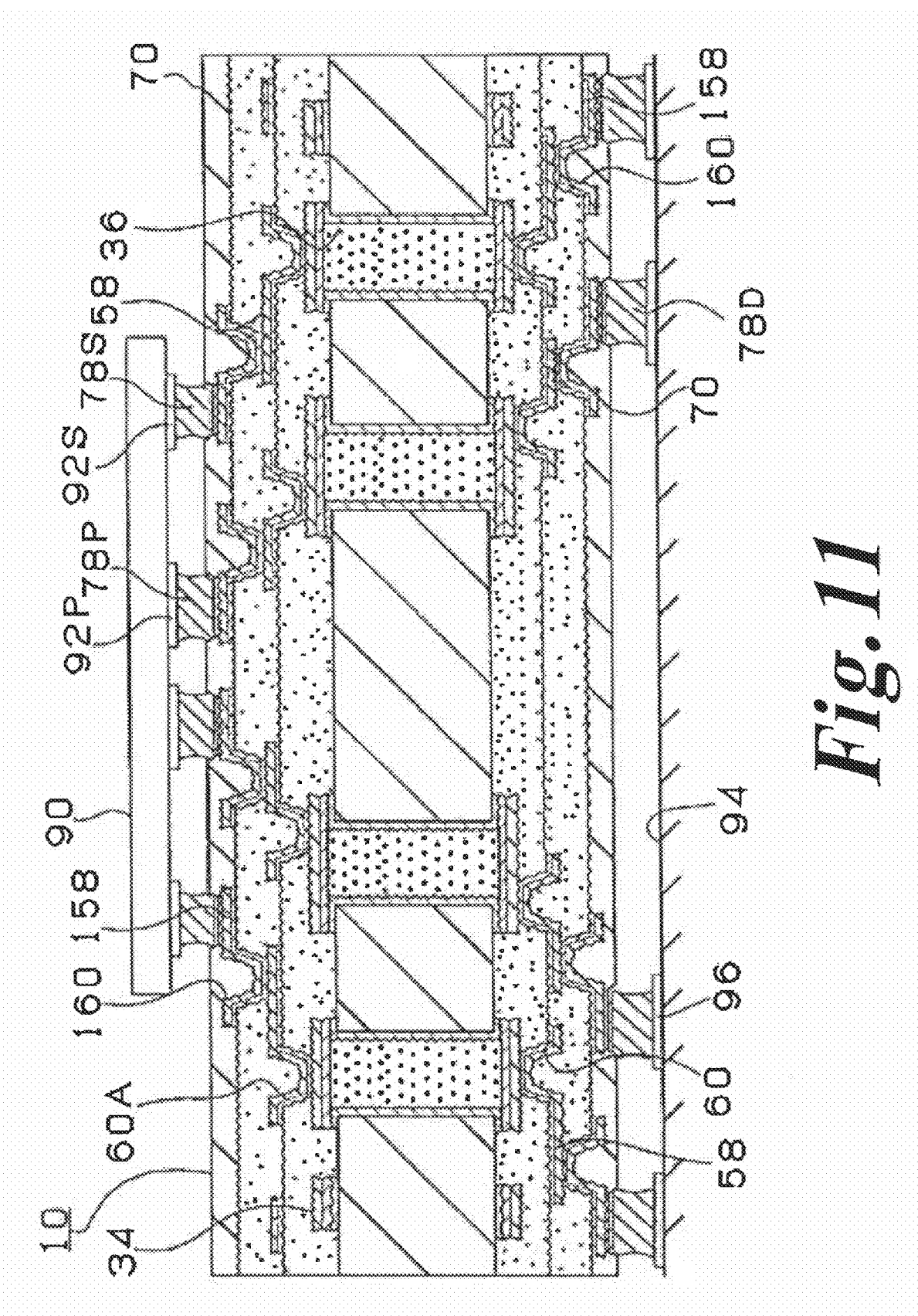
FIG. 11 is a cross-sectional view of a state in which an IC chip is placed on the multilayered printed wiring board in FIG. 10.

Next, with reference to FIG. 1 to FIG. 11, the constitution of the multilayered printed wiring board 10 related to embodiments of the present invention is explained. FIG. 10 shows a cross-sectional view of said multilayered printed wiring board 10 and FIG. 11 shows the board in a state in which an IC chip 90 is mounted on the multilayered printed wiring board 10 in FIG. 10 and placed on a daughter board 94. As shown in FIG. 10, on the multilayered printed wiring board 10, a conductor circuit 34 is formed on the surface of a core substrate 30. The front and back surfaces of the core substrate 30 are jointed through a through-hole 36. On the core substrate 30, an interlayer resin insulation layer 50 upon which a via-hole 60 and a conductor circuit 58 are formed, and an interlayer resin insulation layer 150 on which a via-hole 160 and a conductor circuit 158 are formed are aligned. On the upper layer of said via-hole 160 and conductor circuit 158, a solder-mask layer 70 is formed. A large-diameter (D1=105 μm) aperture 71P and a small-diameter (D2=80 μm) aperture 71S are formed on the solder-mask layer 70, a large-diameter solder bump 78P for power and earth are aligned on the large-diameter aperture 71P, and a small-diameter solder bump 78S for signals is mounted on the small-diameter aperture 71S. The height H1 of the large-diameter solder bump 78P is set approximately 30 μm and the height H2 of the small-diameter solder bump 78S is also set approximately 30 μm. The large-diameter solder bump 78P for power and earth is aligned near the center of the multilayered printed wiring board so as to shorten the wiring distance, while the small-diameter solder bump 78S for signals is alighted relatively apart from the center. On the underside of the multilayered printed wiring board, a solder bump 78D is formed through the aperture 71 of said solder-mask layer 70. In addition, in FIG. 10, although an aperture of the solder mask is formed so as to expose a part of the semiconductor circuit 158, an aperture may be formed so as to include only a via-hole 160 or a via-hole 160 and a part of the semiconductor circuit 158.

With the high integration of IC, solder bumps for signal lines on package substrates are required to become even smaller in diameter and narrower in pitch. On the contrary, in order to support instantaneous increases of consumption power of an IC chip, a solder bump for a power line and earth line on a package substrate is not required to become extremely small in diameter. In other words, because the resistance value of solder bumps made of solder alloy increases with smaller diameters, voltage drops when consumption power increases instantaneously and it causes malfunction of the IC chip. As a corresponding method for such contradicting requirements, it is desirable to use a solder bump with two types of diameters in which a solder bump for signal lines is made smaller in diameter and a solder bump for power and earth is not made smaller in diameter.

As shown in FIG. 11, a large-diameter solder bump 78P for power and earth on the upper side of the multilayered printed wiring board 10 is jointed to an electrode 92P for power and earth of an IC chip 90, and a small-diameter solder bump 78S for signals is joined to an electrode 92S for signals. On the other hand, a solder bump 78D on the lower side is jointed to a land 96 of a daughter board 94.

Continuously, with reference to FIG. 1 to FIG. 6, a method for manufacturing the abovementioned multilayered printed wiring board 10 that was mentioned above with reference to FIG. 10 is explained.

(1) On both sides of an insulating substrate 30 that is made of glass epoxy resin or BT (bismaleimide triazine) resin with thicknesses ranging from 0.2 to 0.8 mm, a copper-clad lamination 30A on which 5 to 250 μm of copper foil 32 is laminated is made as the starting material (FIG. 1 (A)). Firstly, this copper-clad lamination is drilled to make a hole 33 (FIG. 1 (B)), and a lateral conductor layer 36b of a through-hole 36 is formed through nonelectrolytic plating and electrolytic plating (FIG. 1 (C)).

(2) After washing and drying the substrate 30 on which the through-hole 36 is formed, blackening treatment is performed using a blackening bath (oxidizing bath) of aqueous solution containing NaOH (10 g/l), NaClO$_2$ (40 g/l), and Na$_3$PO$_4$ (6 g/l), reduction treatment is performed with a reduction bath of aqueous solution containing NaOH (10 g/l) and NaBH$_4$ (6 g/l), and a rough surface 36α is formed on the lateral conductor layer 36b and the surface of the through-hole 36 (FIG. 1 (D)).

(3) Next, filler 37 (for example, nonconductive filling copper paste manufactured by Tatsuta Electric Wire & Cable Co., Ltd., product name: DD PASTE) containing copper particles with an average particle diameter of 10 μm is filled into a through-hole 36 by screen printing before being dried and hardened (FIG. 2 (A)). This is filled into a through-hole by applying in a printing method on the substrate upon which a mask equipped with an aperture on the through-hole area is placed, and afterwards it is dried and hardened.

Figure 2:
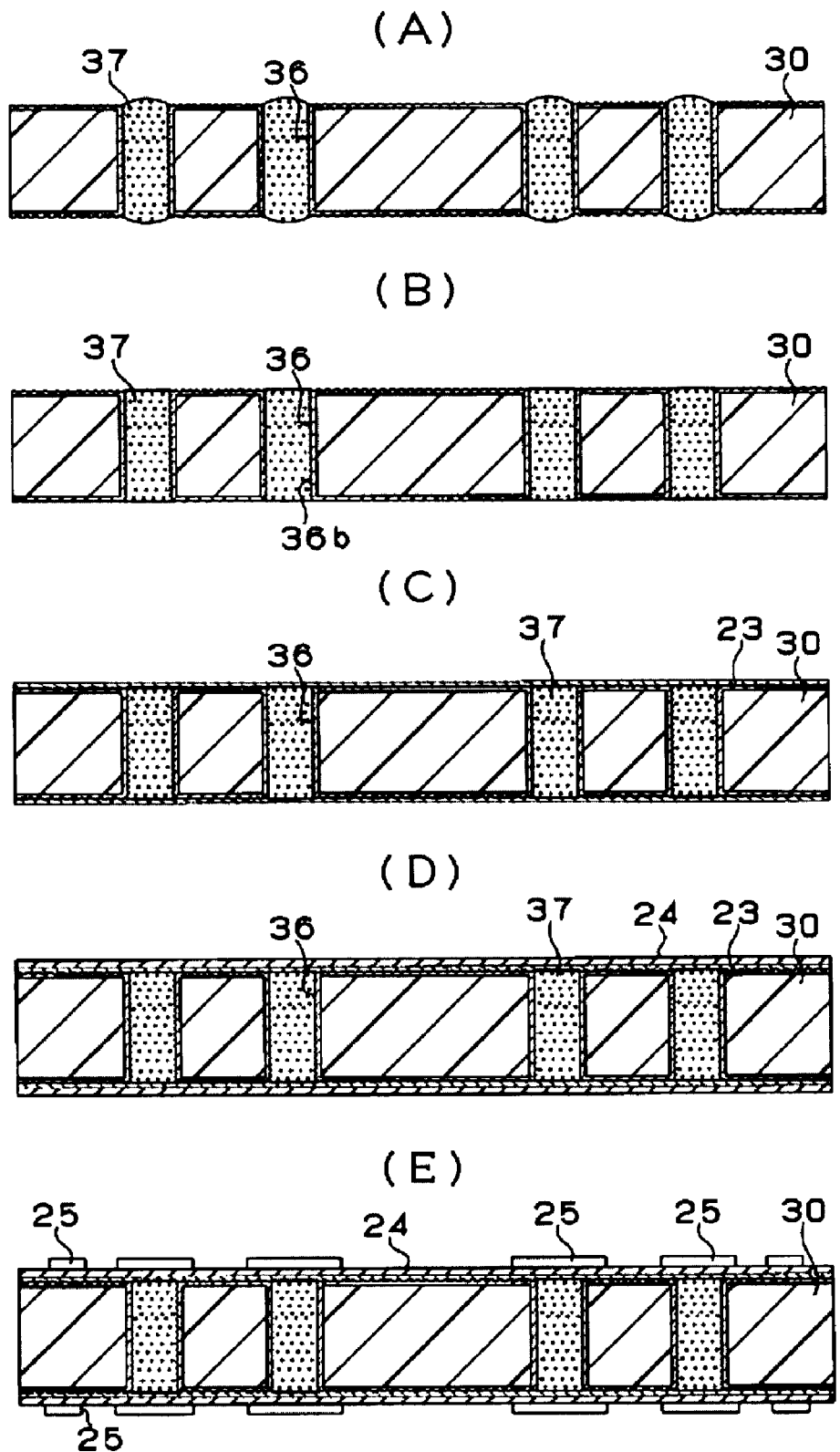
FIG. 2 is a flowchart showing a method for manufacturing a multilayered printed wiring board according to an embodiment of the present invention.

Continuously, the filler 37 protruding from the through-hole 36 is removed by a belt sander with #600 belt abrasive paper (for example, manufactured by Sankyo Rikagaku Co., Ltd.), and further abrased with a puff to remove scratches, caused by this belt sander abrasive, to make the surface of the substrate 30 substantially flat (see FIG. 2 (B)). In this manner, a substrate 30 in which the lateral conductor layer 36b and the resin filler 37 of the through-hole 36 are closely and effectively attached through the rough layer 36α is obtained.

(4) On the surface of the substrate 30 that was made substantially flat in the abovementioned (3), a palladium catalyst (for example, manufactured by Atotech Japan) is provided and treated with electroless copper plating to form an electroless copper plating film 23 with a thickness of 0.6 μm (see FIG. 2 (C)).

(5) Subsequently, by performing electro-copper plating under the following conditions, an electrol copper plating film 24 is formed with a thickness of 15 μm, to provide an area to be a lid-plated layer (through-hole land) to thicken the area to be a semiconductor circuit 34 and cover the filler 37 that is filled in the through-hole 36 (FIG. 2 (D)).

The aqueous solution for electrolytic plating includes:
Sulphuric acid=180 g/l;
Copper sulfate=80 g/l; and
Additive (manufactured by Atotech Japan, product name: Cupracid GL)=1 ml/l.
Conditions for electrolytic plating include:
Current density=1 A/dm$^2$;
Time=70 minutes; and
Temperature=Room temperature.

(6) On both sides of the substrate 30 to be a semiconductor circuit and a lid-plated layer, commercially available photosensitive dry film is attached, a mask is placed, and an etching resist 25 with a thickness of 15 μm is formed by exposing at 100 mJ/cm$^2$, and processed to develop with 0.8% sodium carbonate (see FIG. 2 (E)).

Figure 3:
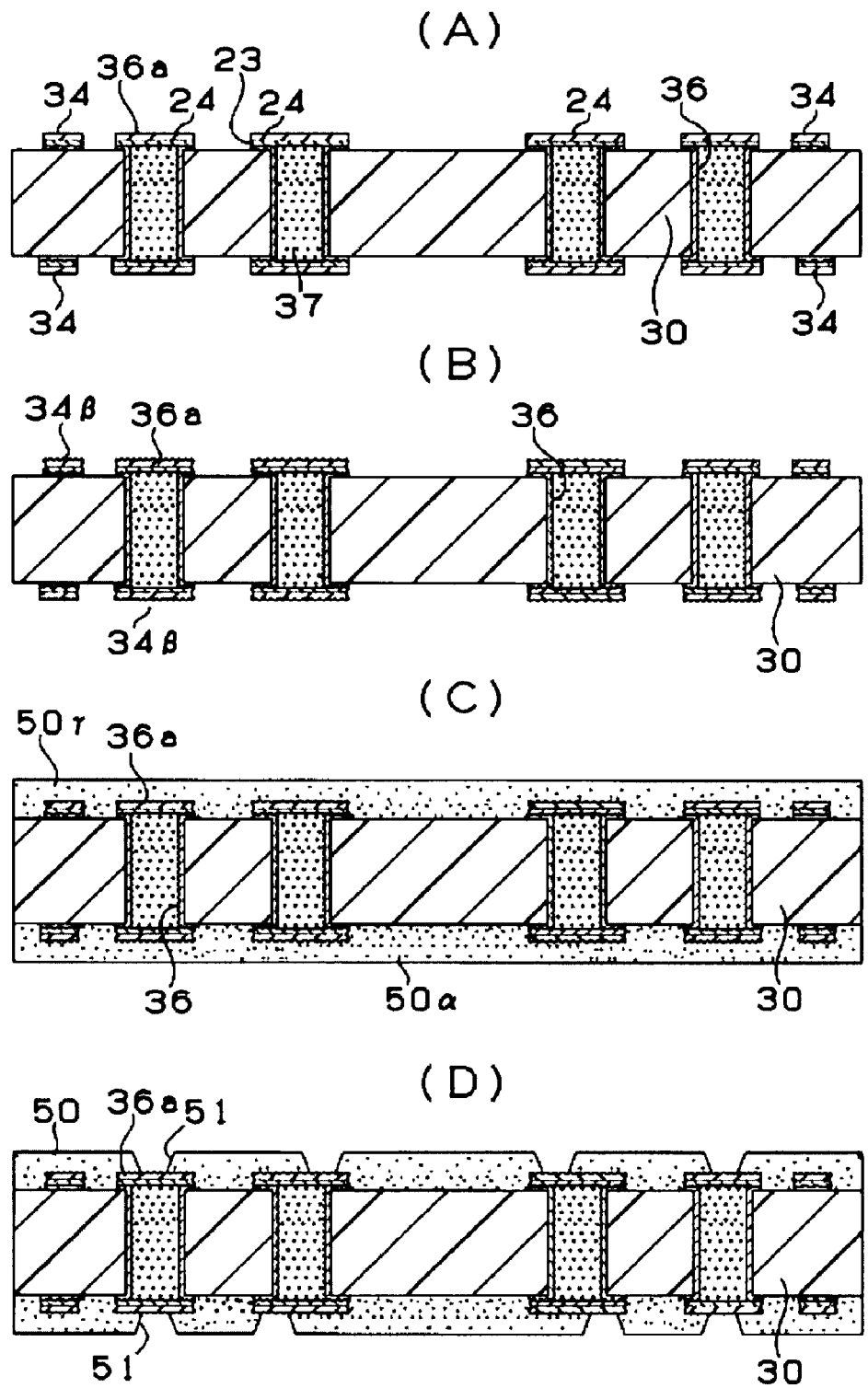
FIG. 3 is a flowchart showing a method for manufacturing a multilayered printed wiring board according to an embodiment of the present invention.

(7) Then, plated film 23, 24 and a copper foil 32 on which the etching resist 25 is not formed is dissolved to remove with etching solution that is composed mostly of cupric chloride, and then the independent semiconductor circuit 34 and the lid-plated layer 36a to cover the filler 37 are formed by delaminating to remove the etching resist 25 with 5% KOH (see FIG. 3 (A)).

(8) Next, on the surface of the semiconductor circuit 34 and the lid-plated layer 36a to cover the filler 37, a rough layer (concavo-convex layer) 34β with a thickness of 2.5 μm made of a Cu-Ni-P alloy is formed, and on the surface of this rough layer 34β, an Sn layer with a thickness of 0.3 μm is formed (see FIG. 3 (B), provided, however, that an Sn layer is not shown).

(9) On both sides of the substrate, a resin film for an interlayer resin insulation layer (for example, manufactured by Ajinomoto Co., Inc.: product name: ABF-45SH) 50γ that is slightly larger than the substrate is placed on the substrate and cut, by temporarily bonding with pressure under 0.45 Mpa of pressure at 80° C. for 10 seconds, and is further attached with a vacuum laminator device in the following method to form an interlayer resin insulation layer 50 (FIG. 3 (C)).

In other words, the resin film for the interlayer resin insulation layer is actually bonded with pressure on the substrate under a vacuum degree of 67 Pa and 0.47 Mpa of pressure at 85° C. for 60 seconds and subsequently hardened with heat at 170° C. for 40 minutes.

(10) Next, with a $CO_2$ gas laser with a wavelength of 10.4 µm, an aperture 51 for a via-hole is formed on an interlayer resin insulation layer 50 (FIG. 3 (D)) under the following conditions: beam diameter of 4.0 mm, top hat mode, pulse width of 3 to 30 µseconds, diameter of through-hole on the mask of 1.0 to 5.0 mm, and with 1 to 3 shots.

Figure 4:
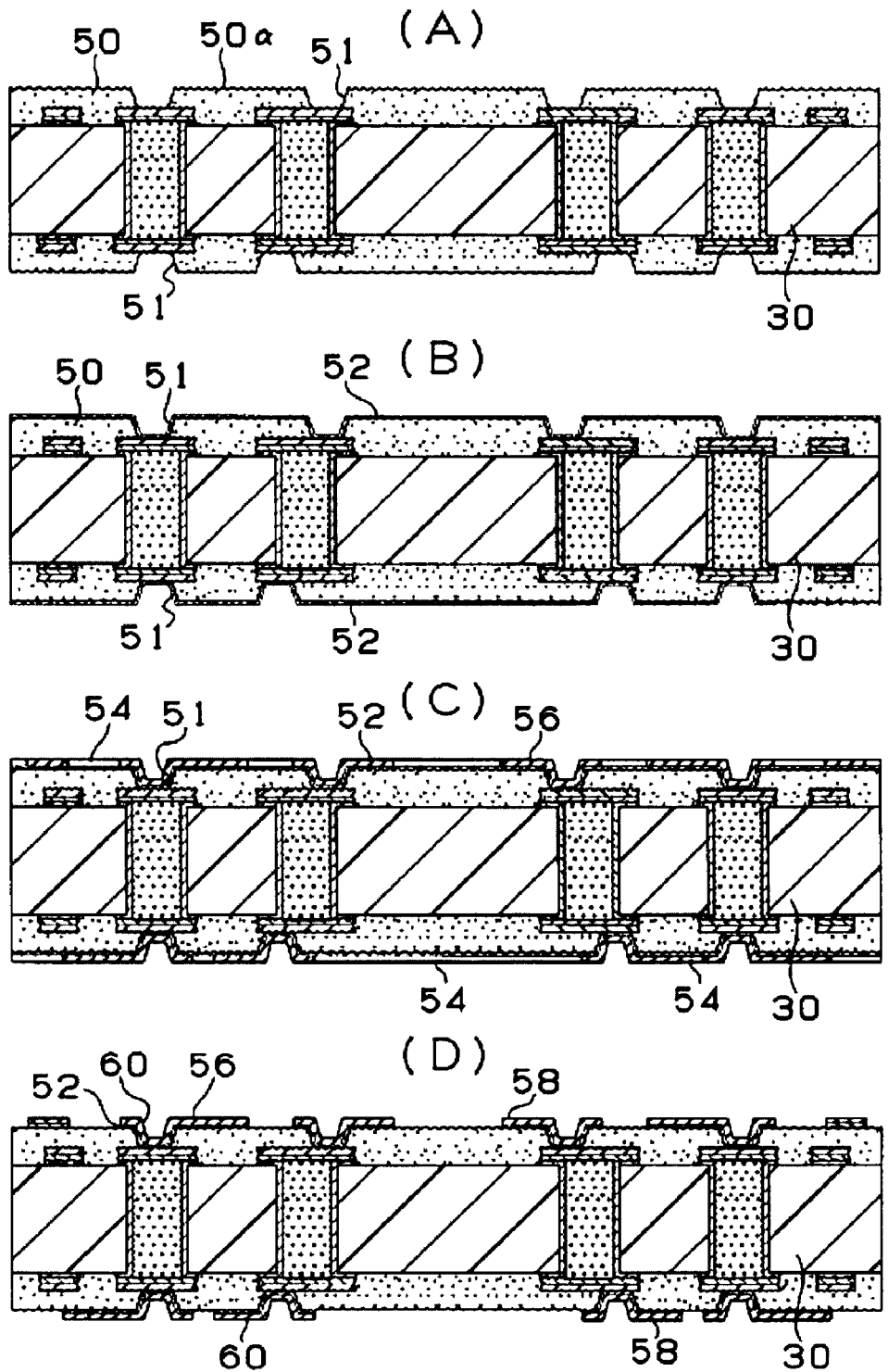
FIG. 4 is a flowchart showing a method for manufacturing a multilayered printed wiring board according to an embodiment of the present invention.

(11) The substrate on which the aperture 51 for the via-hole is formed is soaked into solution containing 60 g/l permanganic acid at 80° C. for 10 minutes, and a rough surface 50α is formed on the surface of the interlayer resin insulation layer 50 including the inner wall of the aperture 51 for the via-hole by removing particles on the surface of the interlayer resin insulation layer 50 (FIG. 4 (A)).

(12) Next, the substrate on which the abovementioned treatment is completed is washed with water after soaking into neutralization solution (for example, manufactured by Shipley Company L.L.C).

Furthermore, by providing a palladium catalyst on the surface of said substrate on which roughening treatment (roughening depth 3 µm) is performed, the nucleus of the catalyst is attached on the surface of the interlayer resin insulation layer and the inner wall of the aperture for the via-hole. In other words, the abovementioned substrate is soaked into a catalyst solution containing palladium chloride ($PbCl_2$) and stannous chloride ($SnCl_2$) and the catalyst is provided by precipitating palladium metal.

(13) Next, the substrate provided with the catalyst is soaked into an aqueous solution for electroless copper plating (for example, THRU-CUP PEA, manufactured by Uyemura & Co., Ltd.), an electroless copper plating film with a thickness of 0.3 to 3.0 µm is formed throughout the rough surface, and a substrate on which the electroless copper plating film 52 is formed on the surface of the interlayer resin insulation layer 50 including the inner wall of aperture 51 for the via-hole is obtained (FIG. 4 (B)). Conditions for nonelectrolytic plating are at 34° C. solution temperature for 45 minutes.

(14) On the substrate on which an electroless copper plating film 52 is formed, a commercially available photosensitive dry film is attached, a mask is placed, and a plated resist 54 with a thickness of 25 µm is mounted by exposing at 110 mJ/cm$^2$ and treating to develop in an 0.8% sodium carbonateaqueous solution. Subsequently, the substrate is washed with water at 50° C. to degrease, washed with water at 25° C., further washed with sulphuric acid, and an electrol copper plating film 56 with a thickness of 15 µm is formed on the area in which the plated resist 54 is not formed by performing electrolytic plating under the following conditions (FIG. 4 (C)).

The solution for electrolytic plating includes:
Sulphuric acid=2.24 mol/l;
Copper sulfate=0.26 mol/l; and
Additive=19.5 ml/l (for example, manufactured by Atotech Japan, Cupracid GL).
The conditions for electrolytic plating include
Current density=1 A/dm$^2$;
Time=70 minutes; and
Temperature=22±2° C.

(15) Furthermore, after delaminating to remove the plated resist 54 with 5% KOH, the nonelectrolytic plating film under the plated resist is dissolved to remove by etching with a mixture of sulphuric acid and hydrogen peroxide to make an independent semiconductor circuit 58 and a via-hole 60 (FIG. 4 (D)).

(16) Subsequently, by performing a similar treatment as the abovementioned (4), on the surface of the semiconductor circuit 58 and the via-hole 60, a rough surface 58α is formed. The thickness of the lower layer semiconductor circuit 58 is 15 µm (FIG. 5 (A)). However, the thickness of the lower layer semiconductor circuit may be formed between 5 to 25 µm.

Figure 5:
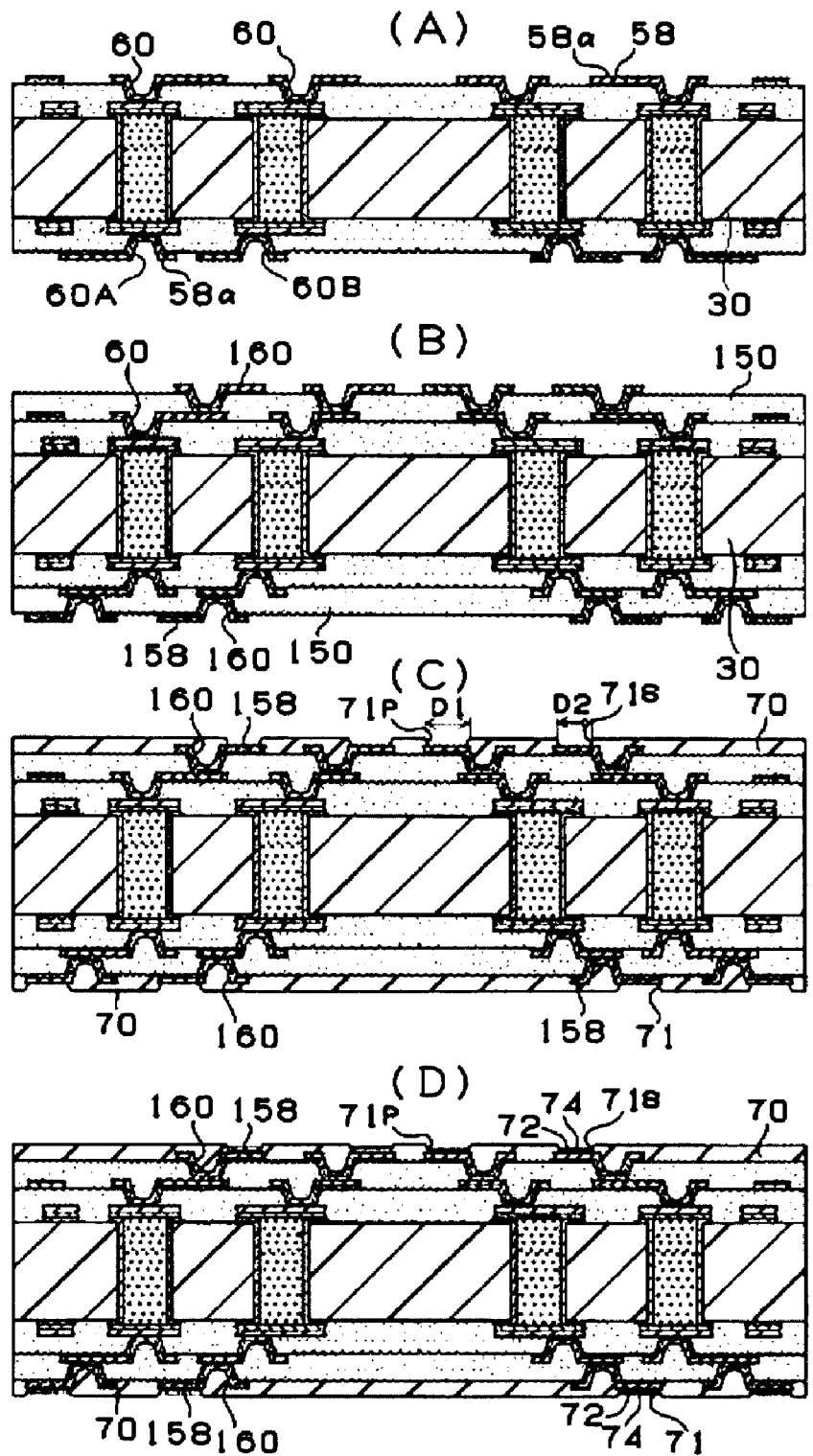
FIG. 5 is a flowchart showing a method for manufacturing a multilayered printed wiring board according to an embodiment of the present invention.

(17) By repeating the abovementioned processes from (9) to (16), a further interlayer insulating layer 150 having an upper layer semiconductor circuit 158 and a via-hole 160 is formed and a multilayered wiring board is obtained (FIG. 5 (B)).

(18) Next, after a commercially available solder mask composition 70 is applied with a thickness of 20 µm on both sides of the multilayered wiring substrate and dried under 70° C. for 20 minutes and at 70° C. for 30 minutes, a photomask with a thickness of 5 mm on which the pattern of the solder mask aperture area is drawn is closely attached to the solder-mask layer 70, exposed to ultraviolet rays at 1,000 mJ/cm$^2$, and treated to develop in the DMTG solution, a large-diameter (D1=105 µm) aperture 71P and a small-diameter (D2=80 µm) aperture 71S are formed on the upper surface and an aperture 71 with diameter of 200 µm is formed on the lower surface (FIG. 5 (C)).

Then, it is further heated under 80° C. for one hour, at 100° C. for one hour, at 120° C. for one hour, and at 150° C. for 3 hours to harden the solder-mask layer, and a solder mask pattern layer with a thickness between 15 to 25 µm having an aperture is formed.

(19) Next, the substrate on which the solder-mask layer 70 is formed is soaked into electroless nickel solution at pH=4.5 containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 20 minutes, and a nickel-plated layer 72 with a thickness of 5 µm is formed on aperture areas 71, 71S, and 71P. Furthermore, the substrate is soaked into electroless gold-plating solution containing gold potassium cyanide ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) at 80° C. for 7.5 minutes, and a gold-plated layer 74 with a thickness of 0.03 µm is formed on the nickel-plated layer 72 to form a conductive pad on the board (FIG. 5 (D)). Other than the nickel-gold layer, a single layer of tin or noble metal layers (gold, silver, palladium, platinum, etc.) may be formed. Further, a conductive pad may be formed without adding metal layers.

Figure 6:
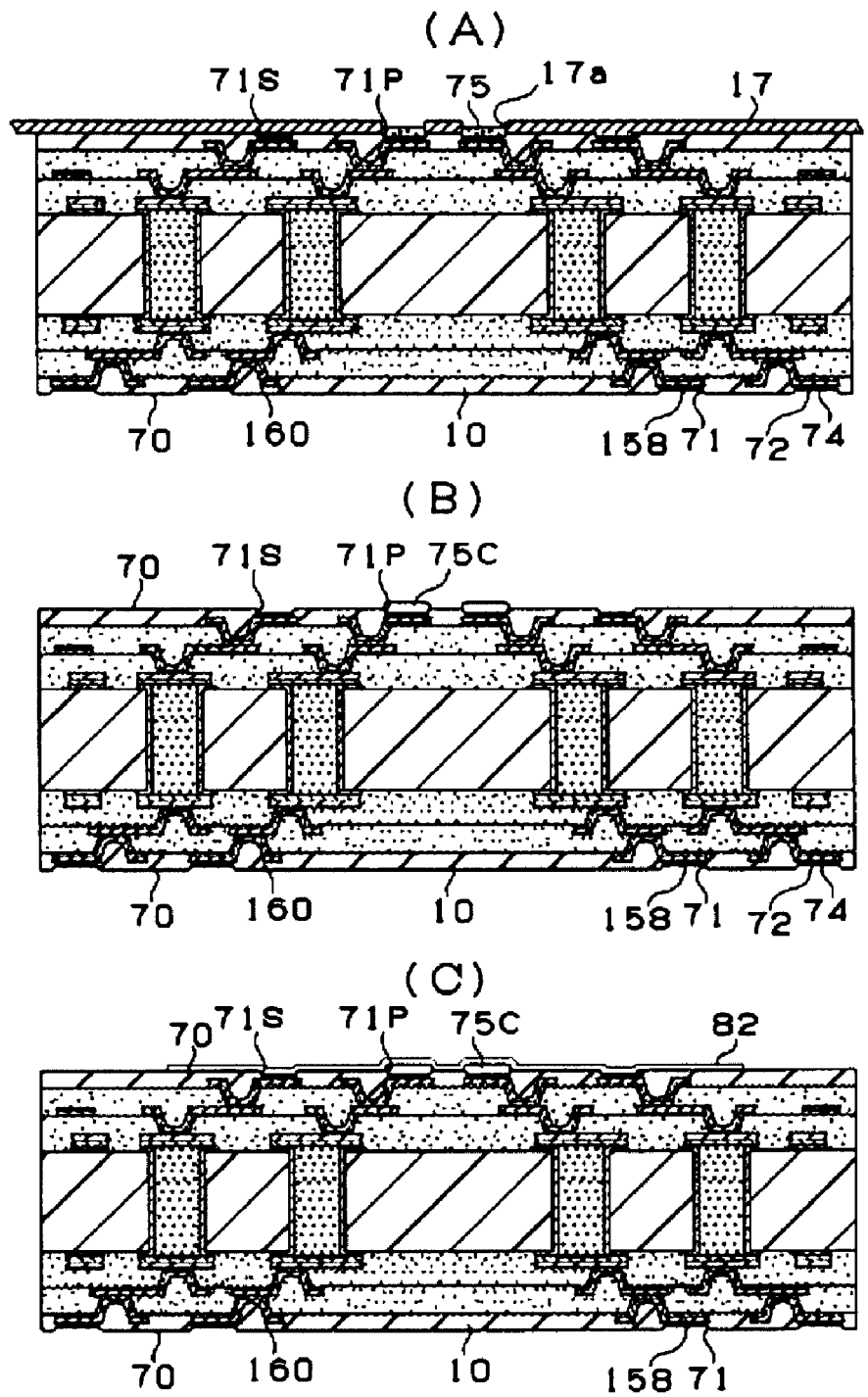
FIG. 6 is a flowchart showing a method for manufacturing a multilayered printed wiring board according to an embodiment of the present invention.

(20) A mask for print 17 having an aperture 17a that corresponds to large-diameter aperture 71P is positioned on the multilayered printed wiring board 10, and a solder paste 75 is printed in the large-diameter aperture 71P (FIG. 6 (A)).

(21) By reflowing at 200° C., the solder paste 75 is converted to a solder body 75C (FIG. 6 (B)).

(22) After washing to reflow, flux 82 is applied to the surface of the solder-resist layer (FIG. 6(C)).

(23) A process to mount a solder ball.

Figure 7:
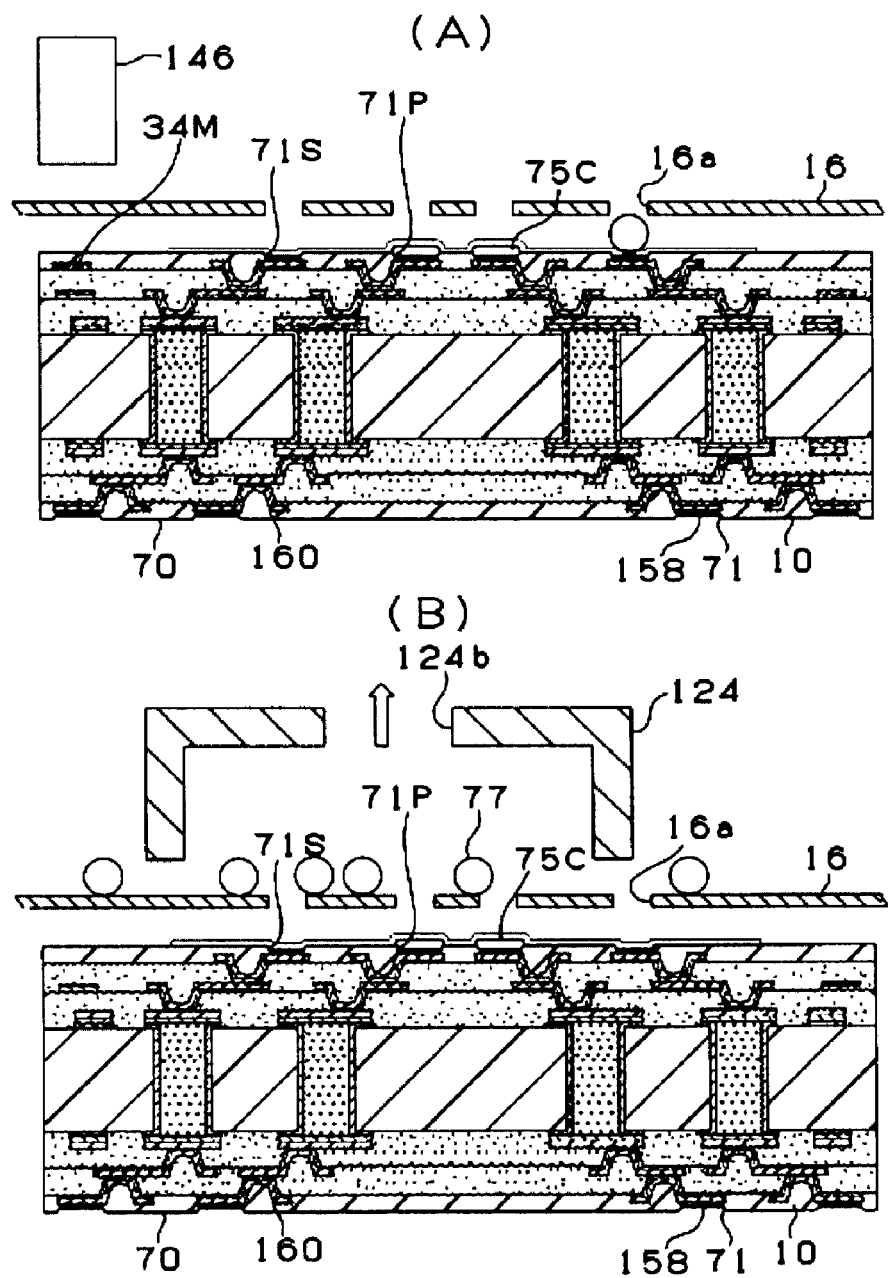
FIG. 7 is a flowchart showing a method for manufacturing a multilayered printed wiring board according to an embodiment of the present invention.

Continuously, with reference to FIG. 7 to FIG. 9, a process to mount a solder ball on the multilayered printed wiring board 10 with the device for mounting a solder ball 100 mentioned above with reference to FIG. 14 is explained.

(I) Recognition and Correction of Position for a Multilayered Printed Wiring Board.

As shown in FIG. 7 (A), an alignment mark 34M for the multilayered printed wiring board 10 is recognized with an alignment camera 146 and the position of the multilayered printed wiring board 10 is corrected with an XYθ suction table 114 against a small-diameter mask for aligning a ball 16. In other words, each aperture 16a of the small-diameter mask for aligning a ball 16 is positioned so as to correspond to the small-diameter aperture 71S of the multilayered printed wiring board 10.

(II) Feeding of Solder Balls.

As shown in FIG. 7 (B), solder balls 77 (diameter 75 μm, Sn63Pb37 (manufactured by Hitachi Metals, Ltd., for example)) are fed with the specified quantity to the mount cylinder 124 from a feeding device for solder balls 122. In addition, it may be pre-fed in the mount cylinder. Although Sn/Pb solder is used for solder balls in the example embodiments, it may be a Pb-free solder with Sn and any optionally selected from Ag, Cu, In, Bi, or Zn, etc.

(III) Mounting of Solder Balls.

As shown in FIG. 8 (A), by positioning the mount cylinder 124 on the upper part of the small-diameter mask for aligning a ball 16 while holding the prescribed clearance (for example, 0.5 to 4 times the ball diameter) with said mask for aligning the ball and intaking air from the suction area 124b, the flow rate in the gap between the mount cylinder and the printed wiring board is made between 5 m/sec to 35 m/sec and solder balls 77 are aggregated on the small-diameter mask for aligning the ball 16 immediately below the aperture area 124A of said mount cylinder 124.

Subsequently, as shown in FIG. 8 (B) and FIG. 9 (A), the mount cylinder 124 aligned along the axis of the multilayered printed wiring board 10 in FIG. 14 (B) and FIG. 14 (A) is sent horizontally along to the X-axis through a moving axis in an X direction 140. In such manner, solder balls 77 aggregated on the small-diameter mask for aligning a ball 16 are moved as the mount cylinder 124 moves, and the solder balls 77 are dropped into the small-diameter aperture 71S of the multilayered printed wiring board 10 through the aperture 16a of the small-diameter mask for aligning the ball 16 to mount. In such manner, the solder balls 77 are aligned sequentially on all the joint pads of the multilayered printed wiring board 10. In another embodiment, the mount cylinder 124 may be held fixed while the board 10 and mask 16 are moved relative to the cylinder 124.

(IV) Removal of absorbed solder balls.

As shown in FIG. 9 (B), after the redundant solder balls 77 are guided to a position where there is no aperture 16a on the small-diameter mask for aligning the ball 16 with the mount cylinder 124, the solder balls 77 are sucked up and removed by the cylinder for removing absorbed balls 161.

(24) Subsequently, by reflowing at 230° C., the solder body 75 on the upper surface and the solder ball 77 are melted, and a large-diameter solder bump 78P is formed from the solder body 75 and the solder ball 77, a small-diameter solder bump 78S is formed from the solder ball 77, and a solder bump 78D is formed from a solder body on the lower surface that is not shown in the figure (FIG. 10).

By placing an IC chip 90 on the multilayered printed wiring board 10 and reflowing, a joint pad of the printed wiring board and an electrode of the IC chip 90 are jointed through the solder bump 78P and 78S. Then, it is mounted on a daughter board 94 through the solder bump 78D (FIG. 11).

According to an embodiment of the invention, where a small-diameter bump 78S is formed from the small-diameter solder ball 77 mounted on the small-diameter aperture 71S of the solder-mask layer 70 and a large-diameter bump 78P is formed from the large-diameter solder ball 77 mounted on the large-diameter aperture 71P, the small-diameter bump 78S and the large-diameter bump 78P with different diameters can be formed at approximately same height. Consequently, when mounting the IC chip 90 through the small-diameter bump 78S and the large-diameter bump 78P, it is possible to improve the mounting yield of the IC chip 90. Also, it is possible to secure joint reliability between the IC chip 90 and the multilayered printed wiring board 10.

Also according to an embodiment of the invention, after the solder body 75C is formed from the solder paste by reflowing, a mask for aligning the ball 16 is used. Because the solder body 75C is not mispositioned even if the mask for aligning the ball 16 comes into contact with the solder body 75C, the mask for aligning the ball 16 can be positioned proximately to the solder-resist layer 70 and the solder ball 77 can be mounted on the large-diameter aperture 71P and small-diameter aperture 71S appropriately, resulting in avoiding mispositioning or missing a large-diameter bump 78P or a small-diameter bump 78S.

Additionally, according to an embodiment, the mount cylinder 124 is positioned on the upper side of the small-diameter mask for aligning a ball 16, solder balls 77 are aggregated by intaking air from said mount cylinder 124, the aggregated solder balls 77 are moved on the mask for aligning a ball 16 by moving the mount cylinder 124 horizontally, and the solder balls 77 are dropped into the small-diameter aperture 71S and large-diameter aperture 71P of the multilayered printed wiring board 10 through the aperture 16a of the mask for aligning the ball 16. Consequently, the fine solder balls 77 can be securely mounted on all (or essentially all) of the small-diameter apertures 71S and large-diameter apertures 71P of the multilayered printed wiring board 10. Additionally, when the solder balls 77 are moved without contacting, unlike in cases involving the use of a squeegee, the solder ball can be mounted on the small-diameter aperture 71S without damaging the solder balls and the height of the solder bump 78S can be made uniform. Furthermore, when the solder balls are guided by a intaking force, it can prevent the solder balls from aggregating and absorbing.

Figure 12:
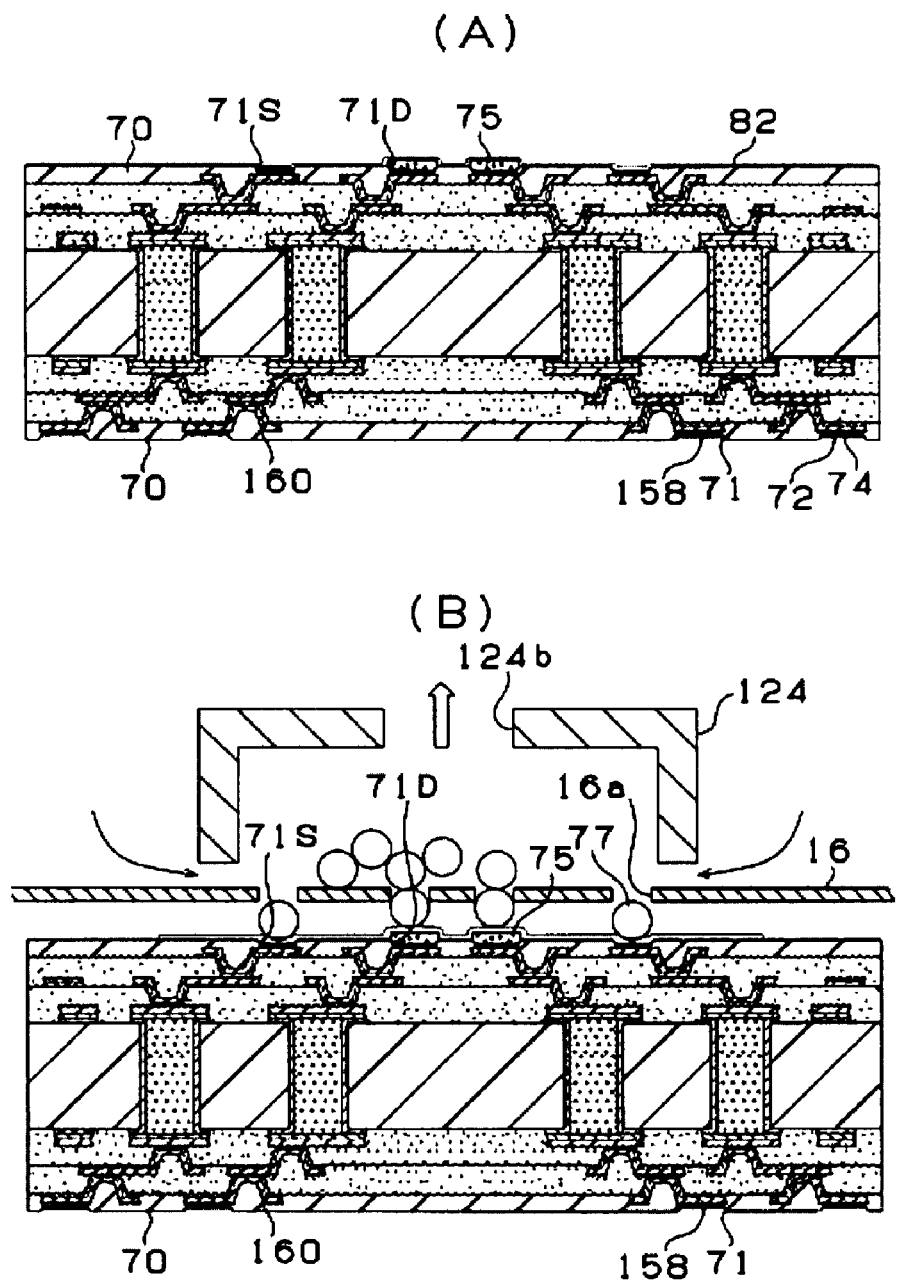
FIG. 12 is a flowchart showing a method for manufacturing a multilayered printed wiring board according to an embodiment of the present invention.

With reference to FIG. 12, a method for manufacturing a printed wiring board according to another embodiment of the present invention is explained. In the previously described embodiments, small-diameter solder balls 77M and large-diameter solder balls 77L are simultaneously reflowed. On the contrary, in the embodiment of FIG. 12, firstly small-diameter solder balls 77M are reflowed and then large-diameter solder balls 77L are mounted on the multilayered printed wiring board to reflow the large-diameter solder balls 77L.

Similar to the embodiment mentioned above with reference to FIG. 6 (A), after printing a solder paste 75 on the small-diameter aperture 71S of the multilayered printed wiring board 10, flux 82 is applied to the solder-resist layer 70 (FIG. 12(A)). By using a mount cylinder 124 of the device for mounting a solder ball 100 and a mask for aligning the ball 16, solder balls 77 are dropped into the small-diameter aperture 71S and large-diameter aperture 71P on the multilayered printed wiring board 10 (FIG. 12(B)). Subsequently, by reflowing at 230 ° C., solder bumps 78P and 78S are formed from the solder ball 77 in the small-diameter aperture 71S, the solder paste 75 in the large-diameter aperture 71P, and the solder balls 77 (FIG. 10). In this embodiment, reducing the number of reflows can prevent decreases in reliability caused by thermal history.

Figure 13:
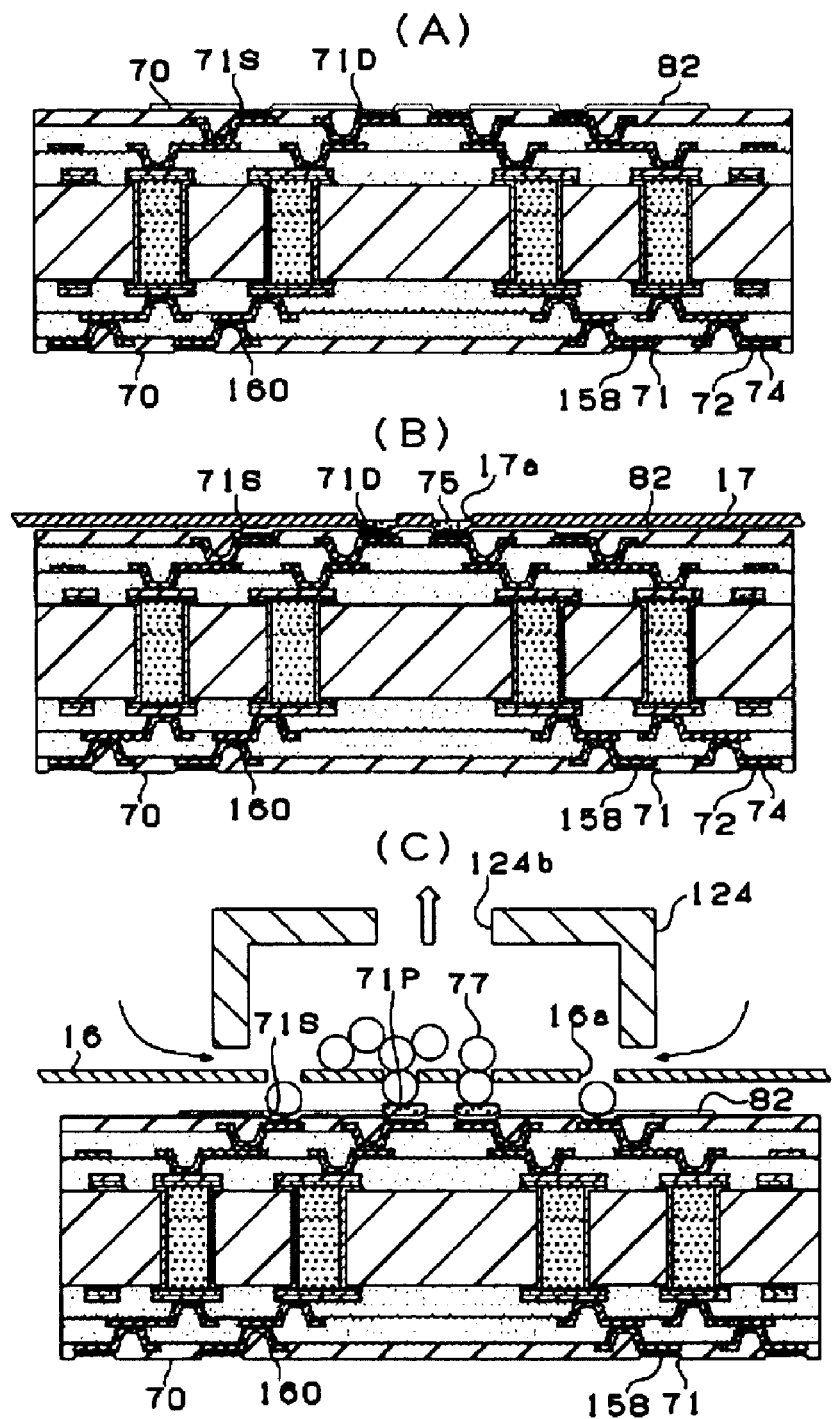
FIG. 13 is a flowchart showing a method for manufacturing a multilayered printed wiring board according to an embodiment of the present invention.

With reference to FIG. 13, a method for manufacturing a printed wiring board according to another embodiment of the present invention is explained. In this embodiment, similar to the embodiment of FIG. 12, solder paste 75 and solder ball 77 are reflowed simultaneously.

Similar to the embodiment mentioned above with reference to FIG. 5 (D), after completing the multilayered printed wiring board, flux is preliminary applied to the solder-resist layer 70 (FIG. 13 (A)). By using a mask 17 for printing, a solder paste 75 is printed on the large-diameter aperture 71P of the multilayered printed wiring board 10 (FIG. 13 (B)). Further, by using a mount cylinder 124 of the device for mounting a solder ball 100 and a mask for aligning the ball 16, solder balls 77 are dropped into the small-diameter aperture 71S and large-diameter aperture 71P on the multilayered printed wiring board 10 (FIG. 13(C)). Subsequently, by reflowing at 230° C., solder bumps 78P and 78S are formed from the solder ball 77 in the small-diameter aperture 71S, the solder paste 75 in the large-diameter aperture 71P, and the solder balls 77 (FIG. 10).

In the embodiment of FIG. 13, reducing the number of reflows can prevent decreases in reliability caused by thermal history. Although a mount cylinder is moved when mounting a solder ball in the abovementioned embodiments, a mask and a printed wiring board may be moved or both may be moved relative to one another.

the invention claimed is:

1. A method for manufacturing a printed wiring board having a bump, comprising:
    forming a solder-resist layer having a small-diameter aperture and a large-diameter aperture, each aperture exposing a respective conductive pad of the printed wiring board;
    printing a solder paste in the large-diameter aperture in the solder-resist layer, but not printing the solder paste in the small-diameter aperture in the solder resist layer;
    loading a solder ball in each of the large-diameter aperture and the small-diameter aperture using a mask having aperture areas that correspond to the small-diameter aperture and large-diameter aperture of the solder-resist layer;
    forming a small-diameter bump from the solder ball in the small-diameter aperture; and
    forming a large-diameter bump from both the solder paste and the solder ball in the large-diameter aperture, wherein the loading a solder ball comprises:
    positioning a cylinder member having an aperture area that faces an upper side of the mask;
    aggregating the solder balls on the mask immediately below the cylinder member by inrushing air to the aperture area of the cylinder member; and
    loading the aggregated solder balls in the small-diameter aperture and the large-diameter aperture in the solder-resist layer through the aperture areas of the mask by moving the cylinder member relative to the mask.

2. A method for manufacturing a printed wiring board having a bump, comprising:
    forming a solder-resist layer having a small-diameter aperture and a large-diameter aperture, each aperture exposing a respective conductive pad of the printed wiring board;
    printing a solder paste in the large-diameter aperture in the solder-resist layer, but not printing the solder paste in the small-diameter aperture in the solder resist layer;
    loading a solder ball in each of the large-diameter aperture and the small-diameter aperture using a mask having aperture areas that correspond to the small-diameter aperture and large-diameter aperture of the solder-resist layer;
    forming a small-diameter bump from the solder ball in the small-diameter aperture; and
    forming a large-diameter bump from both the solder paste and the solder ball in the large-diameter aperture, wherein the loading a solder ball comprises:
    positioning a cylinder member having an aperture area that faces an upper side of the mask;
    aggregating the solder balls on the mask immediately below the cylinder member by inrushing air to the aperture area of the cylinder member; and
    loading the aggregated solder balls in the small-diameter aperture and the large-diameter aperture in the solder-resist layer through the aperture areas of the mask by moving the cylinder member relative to the mask.

3. A method for manufacturing a printed wiring board having a bump, comprising:
    forming a solder-resist layer having a small-diameter aperture and a large-diameter aperture, each aperture exposing a respective conductive pad of the printed wiring board;
    printing a solder paste in the large-diameter aperture in the solder-resist layer, but not printing the solder paste in the small-diameter aperture in the solder resist layer;
    loading a solder ball in each of the large-diameter aperture and the small-diameter aperture using a mask having aperture areas that correspond to the small-diameter aperture and large-diameter aperture of the solder-resist layer;
    forming a small-diameter bump from the solder ball in the small-diameter aperture;
    forming a large-diameter bump from both the solder paste and the solder ball in the large-diameter aperture; and
    applying a flux to the small diameter aperture before mounting the solder ball therein; wherein the loading a solder ball comprises:
    positioning a cylinder member having an aperture area that faces an upper side of the mask,
    aggregating the solder balls on the mask immediately below the cylinder member by inrushing air to the aperture area of the cylinder member; and
    loading the aggregated solder balls in the small-diameter aperture and the large-diameter aperture in the solder-resist layer through the aperture areas of the mask by moving the cylinder member relative to the mask.

4. The manufacturing method for a printed wiring board according to claim 1, comprising:
    removing redundant solder balls, that are not aligned in an aperture of the mask, from the mask by suction.

5. A method for manufacturing a printed wiring board having a bump, comprising:
    forming a solder-resist layer having a small-diameter aperture and a large-diameter aperture, each aperture exposing a respective conductive pad of the printed wiring board;
    printing a solder paste in the large-diameter aperture in the solder-resist layer, but not printing the solder paste in the small-diameter aperture in the solder resist layer;
    loading a solder ball in each of the large-diameter aperture and the small-diameter aperture using a mask having aperture areas that correspond to the small-diameter aperture and large-diameter aperture of the solder-resist layer;
    forming a small-diameter bump from the solder ball in the small-diameter aperture;
    forming a large-diameter bump from both the solder paste and the solder ball in the large-diameter aperture; and applying a flux to the small diameter aperture before mounting the solder ball therein, wherein the loading a solder ball comprises:

positioning a cylinder member having an aperture area that faces an upper side of the mask, aggregating the solder balls on the mask immediately below the cylinder member by inrushing air to the aperture area of the cylinder member; and loading the aggregated solder balls in the small-diameter aperture and the large-diameter aperture in the solder-resist layer through the aperture areas of the mask by moving the mask and printed wiring board relative to the cylinder member.

* * * * *